(12) United States Patent
Vogt, IV et al.

(10) Patent No.: US 10,320,382 B2
(45) Date of Patent: Jun. 11, 2019

(54) POWER LINE COMMUNICATION SMART RELAY

(71) Applicants: Voyomotive, LLC, San Francisco, CA (US); Robert Vogt, IV, Ypsilanti, MI (US); Adam Sloan, Ann Arbor, MI (US)

(72) Inventors: Robert Vogt, IV, Ypsilanti, MI (US); Adam Sloan, Ann Arbor, MI (US)

(73) Assignee: Voyomotive, LLC, San Francisco, CA (US)

( * ) Notice: Subject to any disclaimer, the term of this patent is extended or adjusted under 35 U.S.C. 154(b) by 0 days.

(21) Appl. No.: 15/545,122

(22) PCT Filed: Apr. 13, 2017

(86) PCT No.: PCT/US2017/027324
§ 371 (c)(1),
(2) Date: Jul. 20, 2017

(87) PCT Pub. No.: WO2017/180816
PCT Pub. Date: Oct. 19, 2017

(65) Prior Publication Data
US 2018/0048309 A1  Feb. 15, 2018

Related U.S. Application Data

(60) Provisional application No. 62/323,047, filed on Apr. 15, 2016.

(51) Int. Cl.
*H03K 17/56* (2006.01)
*H03K 17/72* (2006.01)
(Continued)

(52) U.S. Cl.
CPC ............. *H03K 17/72* (2013.01); *H03K 17/00* (2013.01); *H04B 3/548* (2013.01); *H04L 67/125* (2013.01); *H01H 36/00* (2013.01)

(58) Field of Classification Search
None
See application file for complete search history.

(56) References Cited

U.S. PATENT DOCUMENTS 8,698,426 B1 * 4/2014 Nguyen ............... H02H 1/06
                                                    315/177
8,996,628 B2 * 3/2015 Bishel ................ H04L 12/2814
                                                    709/206
(Continued)

*Primary Examiner* — Lincoln D Donovan
*Assistant Examiner* — Khareem E Almo
(74) *Attorney, Agent, or Firm* — The Petruzzi Law Firm; James D. Petruzzi

(57) ABSTRACT

A replacement smart relay having a relay, controlled by a microcontroller operably connected through a power line communication line that receives instructions from a relay controller, the relay has a simulated resistor representative of a reference resistance, the instructions pass through commands that are sent to the relay control terminals to the relay switched terminals to allow the relay to function the same as the relay it is replacing in the existing application, the instructions from the relay controller are capable of opening or closing the relay switched terminals to override a command on the relay control terminals from the existing application based on a set of vehicle conditions communicated to the relay controller, and instructions from the relay controller allow the smart relay to act deterministically when the smart relay is not actively communicating with the relay controller. A feedback circuit may be used to enhance functionality.

19 Claims, 8 Drawing Sheets

(51) Int. Cl.
*H03K 17/00* (2006.01)
*H04L 29/08* (2006.01)
*H04B 3/54* (2006.01)
*H01H 36/00* (2006.01)

(56) References Cited

U.S. PATENT DOCUMENTS

| | | | | |
|---|---|---|---|---|
| 9,480,117 | B2* | 10/2016 | Shirai | H04B 3/54 |
| 9,934,923 | B2* | 4/2018 | Ahmed | H01H 47/001 |
| 2006/0227884 | A1* | 10/2006 | Koga | H04B 3/54 |
| | | | | 375/257 |
| 2008/0100975 | A1* | 5/2008 | Myoung | H02H 3/00 |
| | | | | 361/65 |
| 2013/0203365 | A1* | 8/2013 | Tieman | B60R 25/2018 |
| | | | | 455/90.1 |
| 2014/0268473 | A1* | 9/2014 | Hassan-Ali | B60L 11/1818 |
| | | | | 361/179 |
| 2015/0222349 | A1* | 8/2015 | Sloan | H04B 7/15528 |
| | | | | 455/7 |
| 2017/0302255 | A1* | 10/2017 | Berglund | H03K 3/012 |
| 2018/0190109 | A1* | 7/2018 | Aggarwal | G08C 23/06 |

* cited by examiner

POWER LINE COMMUNICATION SMART RELAY

CROSS REFERENCE TO RELATED APPLICATIONS

This application is based on provisional patent application No. 62/323,047 entitled "Power Line Communication Smart Relay" filed on Apr. 15, 2016, which is hereby incorporated by reference as if fully set forth herein.

FIELD OF THE INVENTION

This invention relates to relays and more specifically a smart relay and a relay controller that communicate over a shared power line with a power line communication protocol.

BACKGROUND OF THE INVENTION

Relays are commonly used in vehicles to control a variety of functions where high current devices are controlled by a switching relay that receives a low current signal. Typically, and traditionally, relays were controlled by simply on/off voltage settings and did not operate in response to condition based sensors or other criteria that together required a particular relay function. Typical relays lacked any deterministic control based on vehicle conditions, sensors, or other factors requiring more than binary inputs. Feedback systems are also not present in traditional relay systems that lack processor control.

BRIEF SUMMARY OF THE INVENTION

The primary advantage of the invention is to provide a smart relay for vehicle control.

Another advantage of the present invention is to provide a method for simulating an onboard relay already present on a vehicle.

Yet another advantage is to provide a system for control of the vehicle that bypasses the current relay built into the vehicle.

Yet another advantage is to provide a relay that communicates with a relay controller via power line communication modems.

Yet still another advantage is to provide a smart relay that responds to feedback from the various vehicle systems and conditions.

A preferred embodiment of the invention provides a smart relay and a relay controller that has a microcontroller, a relay coil, and a power line communication modem. The relay controller has a microcontroller, external inputs, and a power line communication modem. The smart relay and relay controller exchange data over a power line shared by both the smart relay and the relay controller using the power line communication modems with a power line communication protocol. The relay controller sends commands to the smart relay and the smart relay sends status to the relay controller. Vehicle conditions and operating parameters are communicated to and used by the relay controller to alter or override the onboard relay to achieve various vehicle functional changes.

In accordance with a preferred embodiment of the invention, there is shown a replacement smart relay having a relay, controlled by a microcontroller operably connected through a power line communication line that receives instructions from a relay controller, the relay has a simulated resistor representative of a reference resistance, the instructions from the relay controller are capable of allowing the relay switched terminals to be controlled open or closed based on the request on the relay control terminals, to allow the smart relay to function the same as the relay it is replacing in the existing application, the instructions from the relay controller are capable of allowing the relay switched terminals to be controlled open or closed independently of the request on the relay control terminals to override a command from the existing application, based on a set of conditions determined by the relay controller; and the instructions from the relay controller allow the smart relay to act deterministically when the smart relay is not actively communicating with the relay controller.

In accordance with another preferred embodiment of the invention, there is shown a replacement smart relay having a smart relay, controlled by a microcontroller operably connected through a power line communication line that receives instructions from a relay controller, the instructions pass through requests on the relay control terminals to the relay switched terminals to allow the smart relay to function the same as the relay it is replacing in the existing application, and the instructions from the relay controller are capable of opening or closing the smart relay switched terminals to override a command on the relay control terminals from the existing application based on a set of conditions determined by the relay controller.

In accordance with another preferred embodiment of the invention, there is shown a replacement smart relay having a relay, controlled by a microcontroller operably connected through a power line communication line that receives instructions from a relay controller, the instructions from the relay controller are capable of allowing the relay switched terminals to be controlled open or closed independently of the request on the relay control terminals to override a command from the existing application, based on a set of conditions determined by the relay controller, the instructions from the relay controller allow the smart relay to act deterministically when the smart relay is not actively communicating with the relay controller.

Other objects and advantages of the present invention will become apparent from the following descriptions, taken in connection with the accompanying drawings, wherein, by way of illustration and example, an embodiment of the present invention is disclosed.

BRIEF DESCRIPTION OF THE DRAWINGS

The drawings constitute a part of this disclosure and include exemplary embodiments to the invention, which may be embodied in various forms. It is to be understood that, in some instances, various aspects of the invention may be shown exaggerated or enlarged to facilitate an understanding of the invention.

DETAILED DESCRIPTION OF THE PREFERRED EMBODIMENTS

Figure 1:
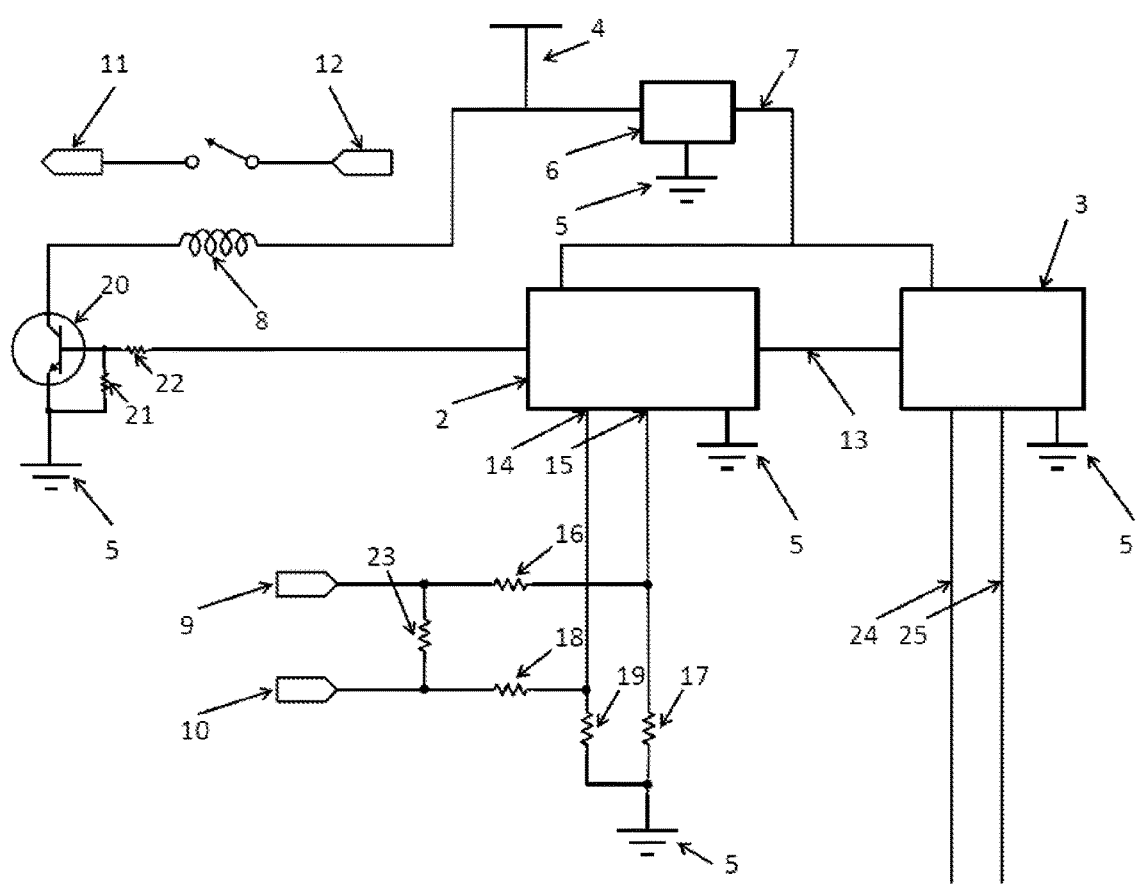
FIG. 1 illustrates a block diagram of a smart relay according to a preferred embodiment of the invention.

Detailed descriptions of preferred embodiments of the invention are provided herein. It is to be understood, however, that the present invention may be embodied in various forms. Therefore, specific details disclosed herein are not to be interpreted as limiting, but rather as a basis for the claims and as a representative basis for teaching one skilled in the art how to employ the present invention in virtually any appropriately detailed system, structure or manner FIG. 1 illustrates a block diagram of a smart relay 1 from FIG. 3. The smart relay 1 has a microcontroller 2 and a power line communication modem 3 that are connected with an electrical connection 13. The power line communication modem 3 exchanges data with the relay controller 33 using the shared power line positive power bus 24 and shared power line reference power bus 25. The smart relay 1 has a voltage regulator 6. A positive supply voltage 4 is input into the voltage regulator 6 with reference to ground 5. The voltage regulator 6 outputs a low voltage positive supply voltage 7. The low voltage positive supply voltage 7 is input into the microcontroller 2 and power line communication modem 3 with reference to ground 5. The smart relay 1 has two control terminals, first control terminal 9 and second control terminal 10. The microcontroller 2 monitors the voltage difference between first control terminal 9 and second control terminal 10 using a resistor voltage divider circuit and two analog to digital converters, first analog to digital converter 14 and second analog to digital converter 15. The resistor voltage divider circuit is comprised of first control terminal 9 voltage divider resistor 16, control terminal 9 voltage divider resistor 17, control terminal 10 voltage divider resistor 18, and control terminal 10 voltage divider resistor 19.

The smart relay 1 has a relay coil 8, a NPN transistor 20, an input terminal 11, and an output terminal 12. One end of the relay coil 8 is connected to positive supply voltage 4. The other end of the relay coil 8 is connected to the collector of the NPN transistor 20. The emitter of the NPN transistor 20 is connected to ground 5, and the base of the NPN transistor 20 is connected to the microcontroller 2. The NPN transistor 20 is biased by first bias resistor 21 and second bias resistor 22. When the microcontroller 2 supplies a voltage to the base of NPN transistor 20, the NPN transistor 20 becomes conductive. When the NPN transistor 20 is in a conductive state, the end of the relay coil 8 that is connected to the NPN transistor 20 is brought down to ground 5 and current flows in the relay coil 8. This causes the relay to close and the circuit between the input terminal 11 and the output terminal 12 to be completed. The smart relay 1 has a coil simulation resistor 23 to simulate the relay coil resistance.

Figure 2:
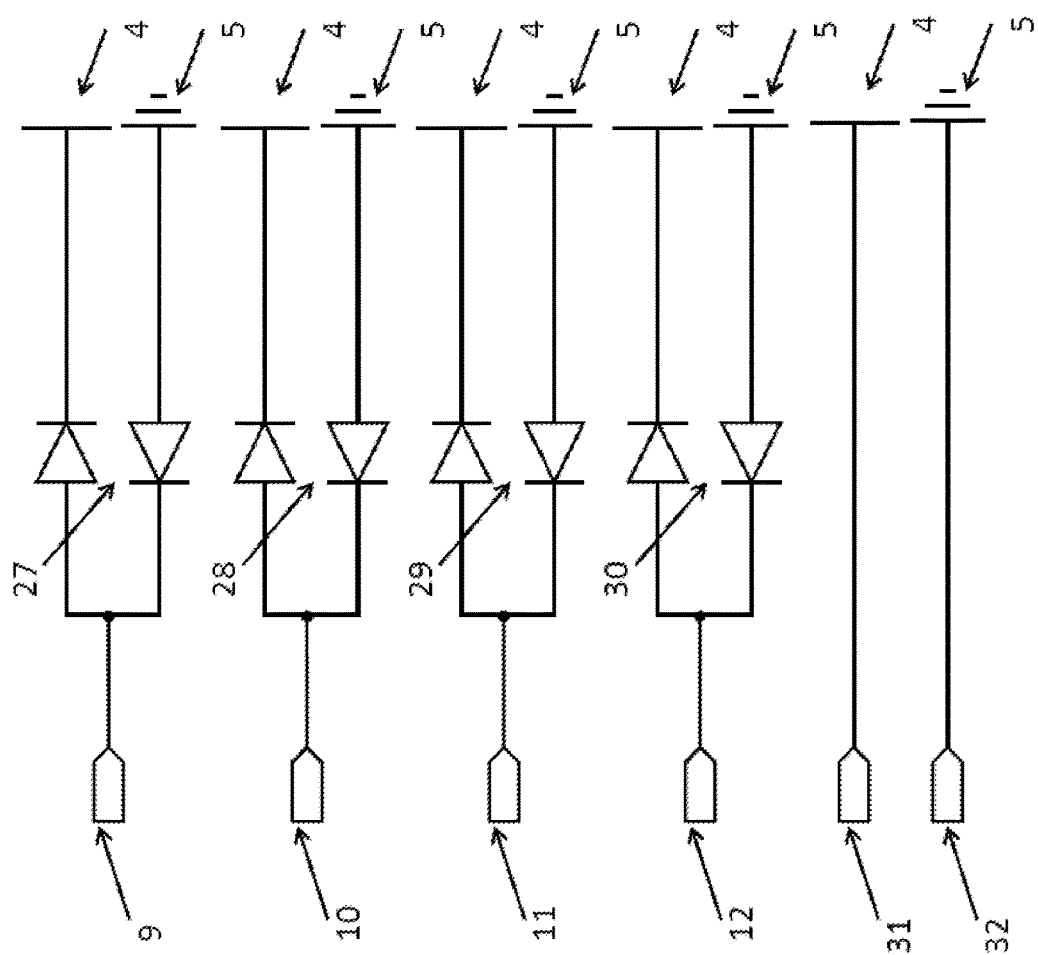
FIG. 2 illustrates a block diagram of a power scavenging circuit which optionally powers the smart relay according to a preferred embodiment of the invention.

FIG. 2 illustrates a block diagram of a power scavenging circuit 26 which optionally powers the smart relay 1. The smart relay 1 has a first control terminal 9, second control terminal 10, input terminal 11, and output terminal 12. There is a diode pair 27 on first control terminal 9, a diode pair 28 on second control terminal 10, a diode pair 29 on the input terminal 11, and a diode pair 30 on the output terminal 12. The power scavenging circuit 26 provides a positive supply voltage 4 and ground 5 to the smart relay 1. The smart relay 1 can also be powered by a positive voltage input 31 and a negative voltage input 32 which provides a positive supply voltage 4 and ground 5 to the smart relay 1.

Figure 3:
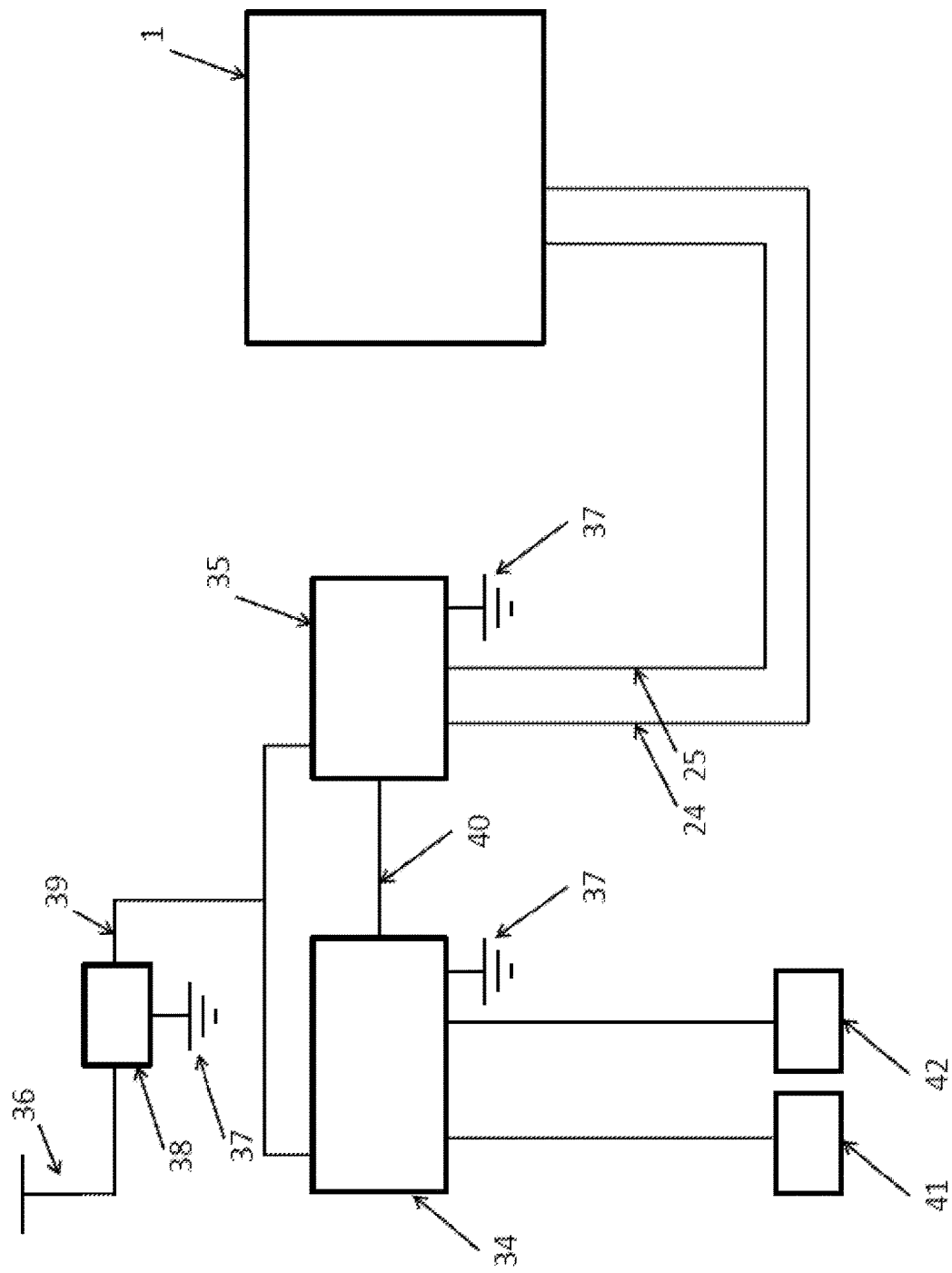
FIG. 3 illustrates a block diagram of a relay controller according to a preferred embodiment of the invention.

FIG. 3 illustrates a block diagram of a relay controller 33. The relay controller 33 has a microcontroller 34 and a power line communication modem 35 that are connected with an electrical connection 40. The power line communication modem 35 exchanges data with the smart relay 1 using the shared power line positive power bus 24 and shared power line reference power bus 25. The relay controller 33 has a voltage regulator 38. A positive supply voltage 36 is input into the voltage regulator 38 with reference to ground 37. The voltage regulator 38 outputs a low voltage positive supply voltage 39. The low voltage positive supply voltage 39 is input into the microcontroller 34 and power line communication modem 35 with reference to ground 37. The microcontroller 34 monitors the relay controller external inputs 41 and 42.

Figure 4:
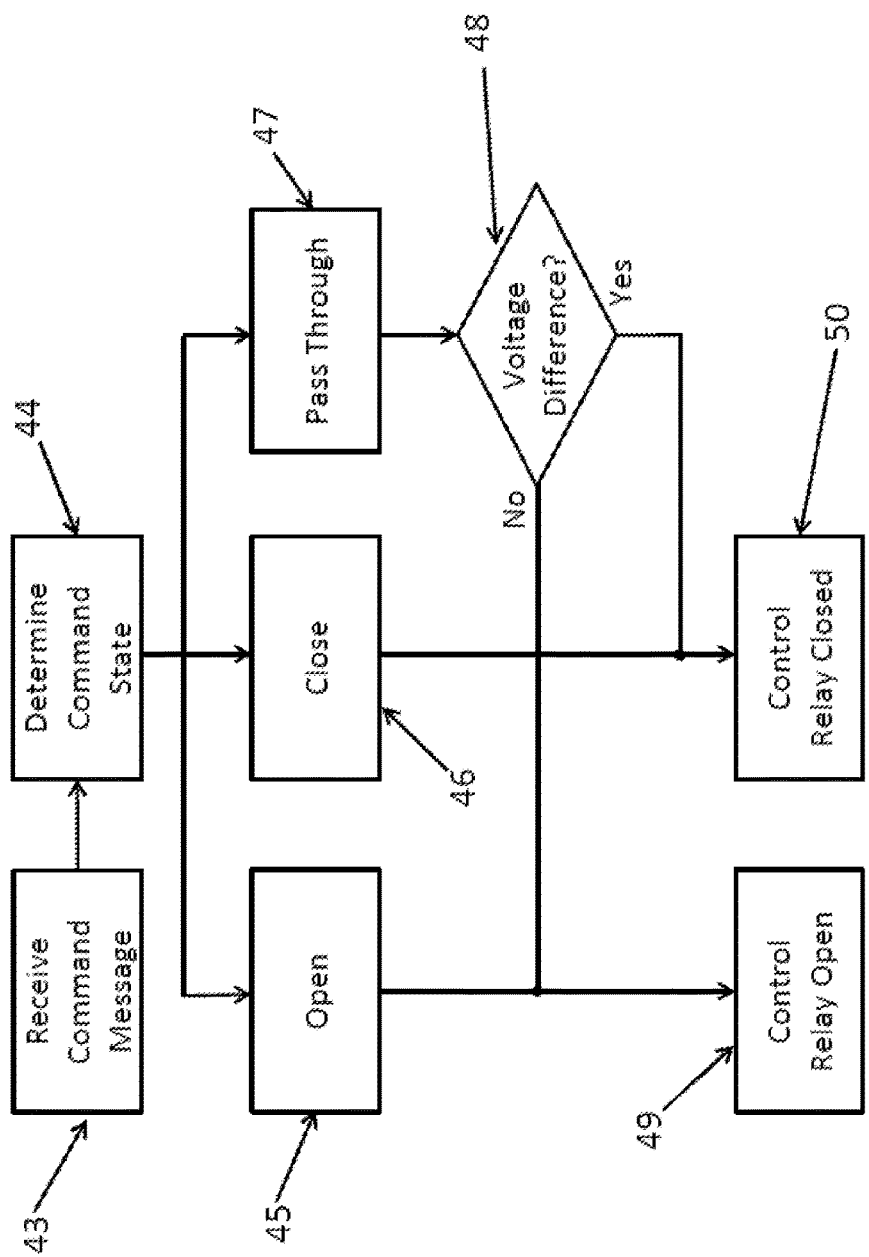
FIG. 4 illustrates a block diagram of the command states that the smart relay receives from the relay controller according to a preferred embodiment of the invention.

FIG. 4 illustrates a block diagram of the command states that the smart relay 1 receives from the relay controller 33. The smart relay 1 uses the command states to determine whether to control the relay circuit to be open or closed. The smart relay 1 receives a command message 43 from the relay controller 33. The smart relay 1 decodes the data that represents the command state within the command message 43 to determine the command state 44. There are 3 command states that the smart relay 1 receives from the relay controller 33: open 45, close 46, and pass through 47. If the smart relay 1 receives a command state of open 45, the smart relay 1 controls the relay circuit to be open 49. If the smart relay 1 receives a command state of close 46, the smart relay 1 controls the relay circuit to be closed 50. If the smart relay 1 receives a command state of pass through 47, the smart relay 1 determines whether the relay circuit is being requested open or closed based on the voltage difference between the two control terminals 48. The smart relay 1 will then control the relay circuit to be open if it is being requested open 49 or control the relay circuit to be closed if it is being requested closed 50.

Figure 5A:
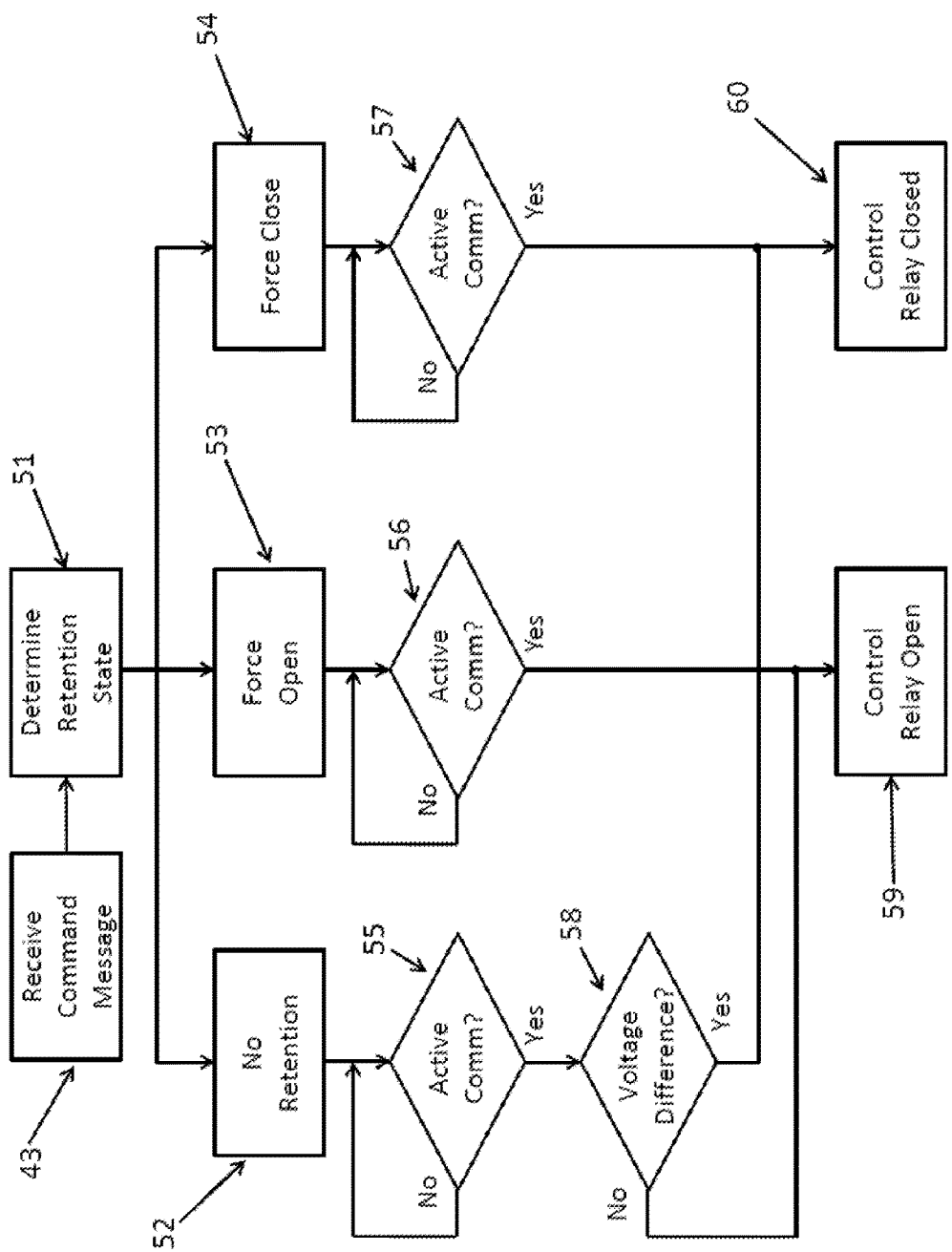
FIG. 5A illustrates a block diagram of the retention states that the smart relay receives from the relay controller according to a preferred embodiment of the invention.

FIG. 5A illustrates a block diagram of the retention states that the smart relay 1 receives from the relay controller 33. The smart relay 1 uses the retention states to determine whether to control the relay circuit to be open or closed when there is not active communication with the relay controller 33. The smart relay 1 receives a command message 43 from the relay controller 33. The smart relay 1 decodes the data that represents the retention state within the command message 43 to determine the retention state 51. There are 5 retention states that the smart relay 1 receives from the relay controller 33: no retention 52, force open 53, force close 54, transition open 61, and transition close 62. After the smart relay 1 has determined the retention state 51, the smart relay 1 determines whether there is active communication with the relay controller 55, 56, 57. For some retention states, the relay also determines whether the relay circuit is being requested open or closed based on the voltage difference between the two control terminals 58. The smart relay 1 controls the relay circuit to be open 59 or controls the relay circuit to be closed 60 based on the retention state 52, 53, 54; whether there is active communication with the relay controller 55, 56, 57; and whether the relay circuit is being requested open or closed 58.

Figure 5B:
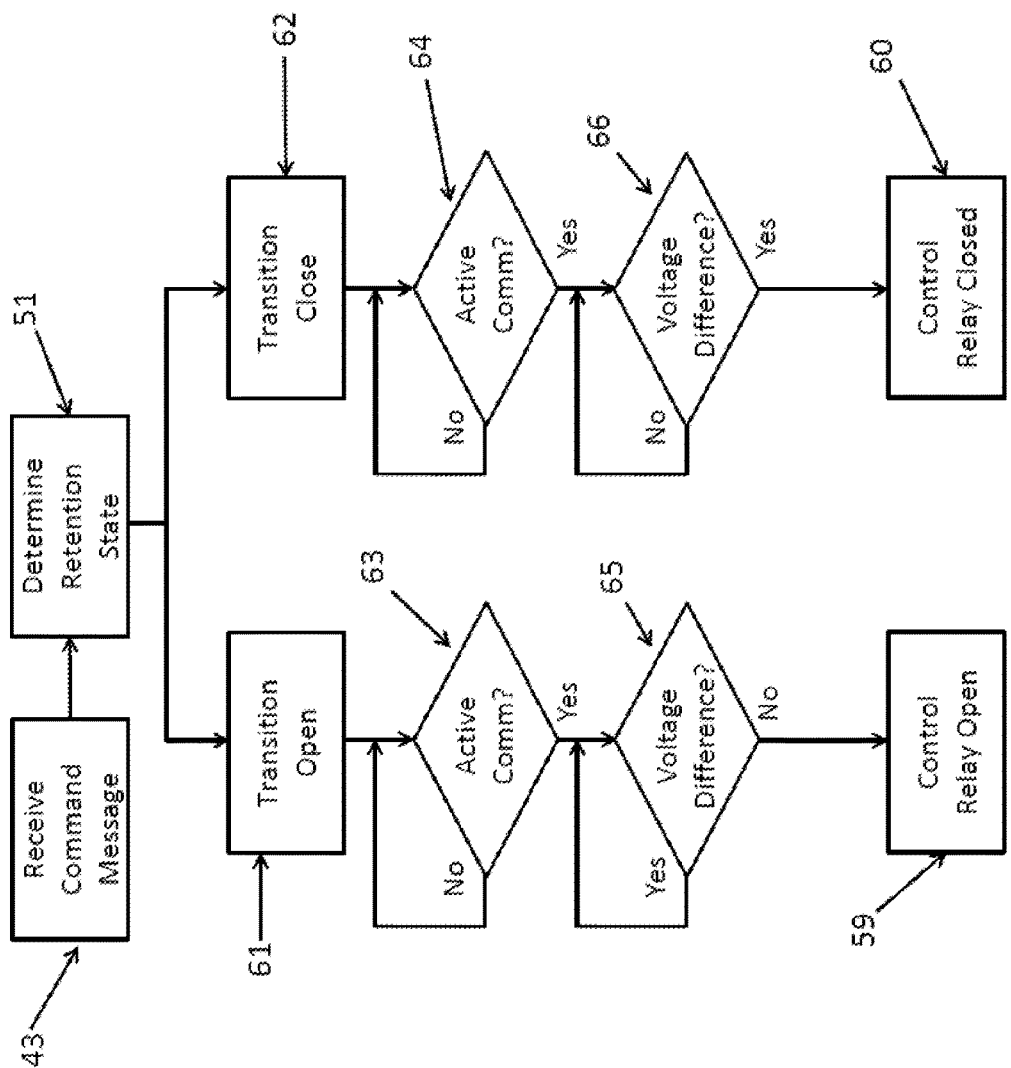
FIG. 5B illustrates a block diagram of the retention states that the smart relay receives from the relay controller according to a preferred embodiment of the invention.

FIG. 5B illustrates a block diagram of the retention states that the smart relay 1 receives from the relay controller 33. The smart relay 1 uses the retention states to determine whether to control the relay circuit to be open or closed when there is not active communication with the relay controller 33. The smart relay 1 receives a command message 43 from the relay controller 33. The smart relay 1 decodes the data that represents the retention state within the command message 43 to determine the retention state 51. There are 5 retention states that the smart relay 1 receives from the relay controller 33: no retention 52, force open 53, force close 54, transition open 61, and transition close 62. After the smart relay 1 has determined the retention state 51, the smart relay 1 determines whether there is active communication with the relay controller 63, 64. For some retention states, the relay also determines whether the relay circuit is being requested open or closed based on the voltage difference between the two control terminals 65, 66. The smart relay 1 controls the relay circuit to be open 59 or controls the relay circuit to be closed 60 based on the retention state 61, 62; whether there is active communication with the relay controller 63, 64; and whether the relay circuit is being requested open or closed 65, 66.

Figure 6:
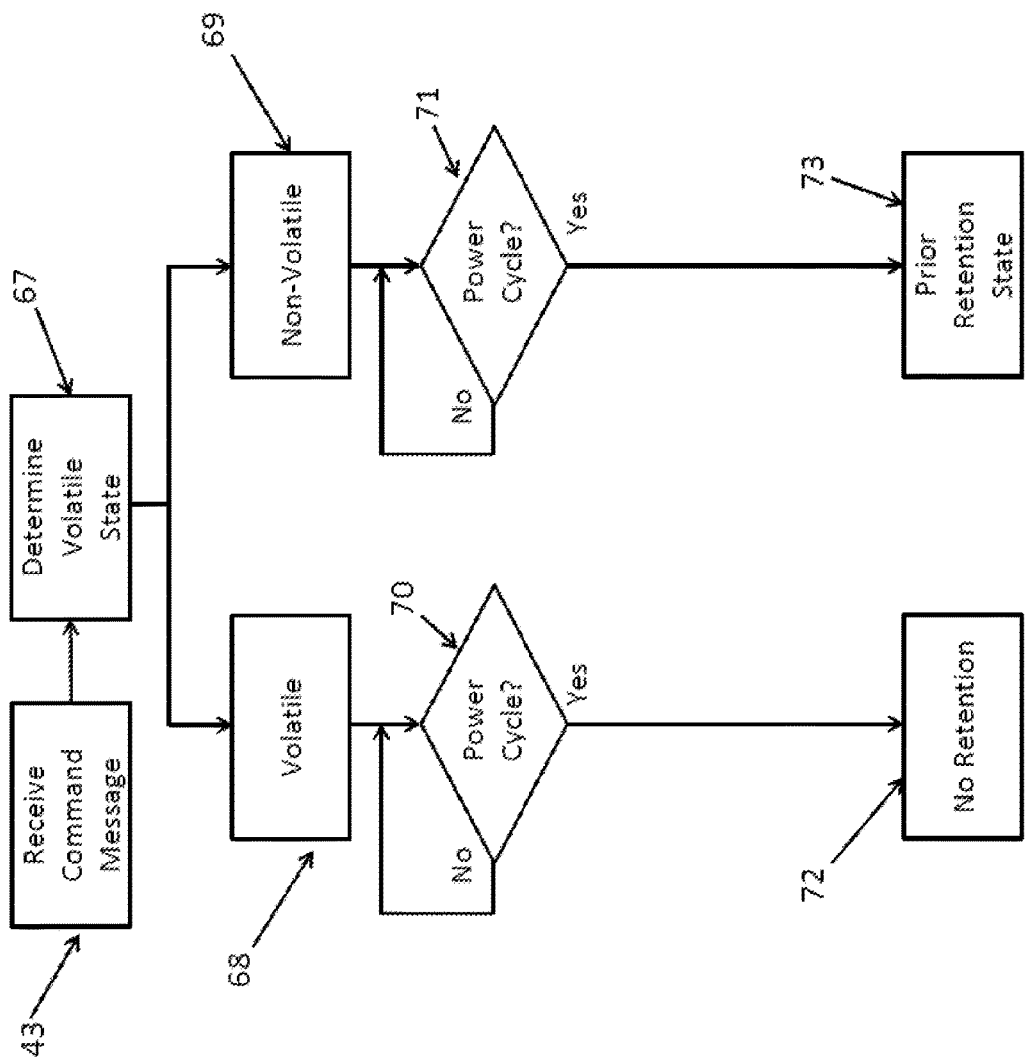
FIG. 6 illustrates a block diagram of the volatile states that the smart relay receives from the relay controller according to a preferred embodiment of the invention.

FIG. 6 illustrates a block diagram of the volatile states that the smart relay 1 receives from the relay controller 33. The smart relay 1 uses the volatile state to determine whether to change its retention state in the event of a power cycle. The smart relay 1 receives a command message 43 from the relay controller 33. The smart relay 1 decodes the data that represents the volatile state within the command message 43 to determine the volatile state 67. There are 2 volatile states that the smart relay 1 receives from the relay controller 33: volatile 68 or non-volatile 69. After the smart relay 1 has determined the volatile state 67, the smart relay 1 determines whether there has been a power cycle 70, 71. If the smart relay 1 receives a volatile state of volatile 68, when there is a power cycle 70 the retention state instead becomes no retention 72. The smart relay 1 does not maintain the retention state that it had prior to the power cycle. If the smart relay 1 receives a volatile state of non-volatile 69, when there is a power cycle 71 the smart relay 1 maintains the retention state that it had prior to the power cycle 73.

A relay is an electrical switch that is typically used to control a high current circuit with a low current signal. A normally open electromechanical relay typically has two control terminals, a coil, movable contacts, an input terminal, and an output terminal. When there is a sufficiently large voltage difference between the two control terminals, current flows through the coil which generates a magnetic field, and causes the movable contacts to complete the circuit between the input terminal and the output terminal. When there is not a sufficiently large voltage difference between the two control terminals, no current flows through the coil, there is a non-conductive air gap between the input terminal and the output terminal, and thus the circuit is not completed.

Relays are frequently used in automotive applications to control high current loads with low current signals from an electronic control unit (ECU) on the vehicle. Examples of this include the starter motor, fuel injectors, spark plugs, fuel pump, headlights, and the horn. The vehicle ECUs cannot source enough current to drive these high current loads, so they instead provide a low current signal to a relay. When a normally open relay is used, one of the control terminals of the relay is typically connected to ground, and the other control terminal is typically connected to the vehicle ECU. The input terminal of the relay is typically connected to the +12V power bus and the output terminal of the relay is typically connected to the +12V power bus input of the load. When the ECU wants to request the load on, it outputs a voltage on the control terminal that it is connected to. This creates a sufficiently large voltage difference between the two control terminals, which completes the circuit between the input terminal and the output terminal, which provides +12V power to the load and causes it to turn on. When the ECU wants to request the load off, it grounds the control terminal that it is connected to. Now there is not a sufficiently large voltage difference between the two control terminals, the circuit between the input terminal and the output terminal is not completed, no +12V power is provided to the load, which causes it to turn off.

The smart relay 1 is used in place of an existing conventional relay application, and allows for much greater control of the operation of the circuit that the relay is placed in. The smart relay 1 has the ability to determine if the relay circuit is being requested open or closed based on the voltage difference between the two control terminals. The smart relay 1 also has the ability to control whether the relay circuit is open, such that the circuit between the input terminal 11 and the output terminal 12 is not completed; or closed, such that the circuit between the input terminal 11 and the output terminal 12 is completed. The smart relay 1 can control whether the circuit between the input terminal 11 and the output terminal 12 is open or closed independently of whether the relay circuit is being requested open or closed.

In the automotive application example, the smart relay 1 has the ability to determine whether the ECU is requesting the load off or on. The smart relay 1 also has the ability to control whether the load is off or on, independently of whether the ECU is requesting the load off or on. Thus, the smart relay microcontroller 2 has the ability to pass through the request from the ECU, such that the load will be off when the ECU is requesting the load off, and the load will be on when the ECU is requesting the load on. The smart relay microcontroller 2 has the ability to force the load off, even if the ECU is requesting the load on. The smart relay microcontroller 2 has the ability to force the load on, even if the ECU is requesting the load off.

The smart relay 1 has a relay coil 8, two control terminals 9 and 10, an input terminal 11, and an output terminal 12, just like a conventional electromechanical relay. The smart relay microcontroller 2 monitors the voltage difference between the two control terminals 9 and 10. If the voltage difference between the two control terminals 9 and 10 is sufficiently large that it would close a conventional electromechanical relay, the microcontroller 2 determines that the relay is being requested closed. If the voltage difference between the two control terminals 9 and 10 is not sufficiently large to close a conventional electromechanical relay, the microcontroller 2 determines that the relay is being requested open.

The smart relay microcontroller 2 monitors the voltage difference between the two control terminals 9 and 10 using a resistor voltage divider circuit and the microcontroller analog to digital converters 14 and 15. The two control terminals 9 and 10 of the smart relay 1 are input into the resistor voltage divider, which are then output to the microcontroller 2. The resistor voltage divider reduces the voltage on the two control terminals 9 and 10 to a voltage that is in an acceptable voltage range for the microcontroller 2. The microcontroller analog to digital converters 14 and 15 convert the voltages output from the resistor voltage divider to digital values. Comparison of these digital values yields both the magnitude and polarity of the signal being applied to the two control terminals 9 and 10 of the smart relay 1. The values of the resistors 16, 17, 18, and 19 in the resistor voltage divider depend upon the maximum voltage that will be present on the two control terminals 9 and 10 of the smart relay 1 for a specific application. The resistor values should be selected such that the voltages output from the resistor voltage divider are in a voltage range of 3-3.5 volts at the maximum voltage that will be present on the two control terminals 9 and 10 of the smart relay 1. The values of the resistors can be rather large, resistors of around 100 kilo-ohms are useful in the resistor voltage divider.

The smart relay microcontroller 2 can control whether the circuit between the input terminal 11 and the output terminal 12 is open or closed by supplying a to voltage to the base of the NPN transistor 20. Within the smart relay 1, one end of the relay coil 8 is connected to positive supply voltage 4, and the other end of the relay coil 8 is connected to the collector of the NPN transistor 20. The emitter of the NPN transistor 20 is connected to ground 5, and the base of the NPN transistor 20 is connected to the microcontroller 2. The NPN transistor 20 is biased by bias resistors 21 and 22. When the microcontroller 2 supplies a voltage to the base of the NPN transistor 20, the NPN transistor 20 becomes conductive. When the NPN transistor 20 is in a conductive state, the end of the relay coil 8 that is connected to the NPN transistor 20 is brought down to ground 5 and current flows in the relay coil 8. This causes the relay to close and the circuit between the input terminal 11 and the output terminal 12 to be completed. The microcontroller 2 can thus complete the circuit between the input terminal 11 and the output terminal 12 by supplying a to voltage to the base of the NPN transistor 20. If the microcontroller 2 does not supply a voltage to the base of the NPN transistor 20, the circuit between the input terminal 11 and the output terminal 12 is not completed.

With a conventional electromechanical relay, current flowing through the relay coil causes the circuit between the input terminal and the output terminal to be completed. The resistance of a typical electromechanical relay coil is approximately 50 to 1000 ohms. Sometimes the circuit in which a relay is placed monitors for proper relay coil resistance to determine if the relay is operating properly. The smart relay 1 has a coil simulation resistor 23 to simulate the relay coil resistance. Thus, if the circuit in which the smart relay 1 is placed is monitoring for proper resistance, the circuit will still work as expected. The values of the resistors in the resistor voltage divider circuit are much larger than the value of the coil simulation resistor 23. Accordingly, the effect of the resistor voltage divider circuit resistors 16, 17, 18, and 19 on the coil simulation resistor 23 is negligible.

The smart relay 1 can obtain power from several different sources. The smart relay 1 power source can be a power scavenging circuit 26, which derives power from any voltage source connected to any terminal of the relay. The power scavenging circuit 26 comprises an array of diodes 27, 28, 29, and 30 arranged so that a positive voltage and current on any terminal will provide power for the positive supply voltage 4. In a floating ground application, a negative voltage on any terminal will provide voltage differential between the positive supply voltage 4 and the floating ground. In a floating ground application, the smart relay 1 is able to obtain power from any terminal on the relay which happens to have either a negative or positive voltage input. In the power scavenging circuit 26, all relay terminals are connected to the positive supply voltage 4 and ground 5 by two diodes of opposite polarity. In other words, every relay input at any terminal is connected to the anode of one diode, and cathode of that diode is connected to positive supply voltage 4. The relay input is also connected to the cathode of another diode, and the anode of that diode is connected to ground 5. By this means, in an application with a floating ground, if a relay input has any voltage, it will serve to either make the ground 5 more negative or the positive supply voltage 4 more positive. Any voltage on any relay terminal will increase the potential difference between the positive supply voltage 4 and ground 5. In applications with a true earth ground, negative voltages on the relay terminals will not serve to scavenge power, because a negative voltage cannot make an earth ground more negative. However, a positive voltage on any terminal can provide power for the positive supply voltage 4. The power scavenging circuit 26 allows the same smart relay 1 to be used in relay circuits with many different pin combinations of inputs, outputs, positive supply voltage, and negative supply voltage.

Alternatively, the power source could be a small battery that is packaged with smart relay 1. The positive connection of the small battery is connected to the smart relay positive voltage input 31 and the negative connection of the small battery is connected to the smart relay negative voltage input 32. The small battery needs to have sufficient voltage and current capabilities to power the smart relay 1 including the microcontroller 2, relay coil 8, and the power line communication modem 3. For example, a 5 volt small battery with the capacity to supply 1 amp of current could be used.

Alternatively, the smart relay 1 can obtain power from an external power source. The smart relay 1 has a positive voltage input 31 and a negative voltage input 32 which allow the smart relay 1 to be externally powered. In automotive applications, the external power source could be the vehicle +12V battery. The terminals of the smart relay 1 that are connected to the positive voltage input 31 and negative voltage input 32 connect to the mating terminals of the vehicle relay socket that are connected to the vehicle +12V DC power bus and the ground DC power bus.

The smart relay 1 has a voltage regulator 6. The voltage regulator 6 accepts a variable input voltage, typically in the range of 5V-25V, and outputs a constant voltage of 3-3.5 volts. The smart relay positive supply voltage 4 is connected to the input of the voltage regulator 6, and the output of the voltage regulator 6 is the low voltage positive supply voltage 7. The smart relay microcontroller 2 and power line communication modem 3 operate at relatively low voltage, for example 3-3.5 volts, and receive power from the smart relay low voltage positive supply voltage 7 with reference to ground 5. A linear voltage regulator or switching voltage regulator may be used, for example the Texas Instruments LP 2950 may be used. The Texas Instruments LP 2950 can be used in an adjustable mode to provide an adjustable output voltage.

Electromechanical relays are typically used in the smart relay 1. Alternatively, solid state relays can be used. Solid state relays are typically smaller in size than an electromechanical relay, which can be an advantage for the smart relay 1. Solid state relays also switch faster and can be more durable than an electromechanical relay since there are no moving parts. Conversely, solid state relays have a lower ability to withstand momentary overload and reverse voltage conditions. Appropriate protection circuitry must be used with the solid state relay to protect against these conditions.

The smart relay 1 typically uses a normally open relay. Alternatively, the smart relay 1 can use a normally closed relay. With a conventional normally closed relay, the circuit between the input terminal 11 and output terminal 12 is completed when there is not a sufficiently large voltage difference between the two control terminals 9 and 10. The circuit between the input terminal 11 and output terminal 12 is not completed when there is a sufficiently large voltage difference between the two control terminals 9 and 10. The normally closed smart relay 1 configuration can be used in a relay circuit where the circuit between the input terminal 11 and output terminal 12 is normally completed. This will save power as compared to a normally open relay in this configuration, since power is not lost to current flowing through the relay coil 8 when the circuit between the input terminal 11 and output terminal 12 is completed. The smart relay 1 can also be single pole, double throw; double pole, double throw, or other configurations of relay poles and throws.

There are 3 command states that the smart relay 1 receives from the relay controller 33: open 45, close 46, and pass through 47. If the smart relay 1 receives a command state of open 45, the smart relay 1 controls the relay circuit to be open 49, even when the relay circuit is being requested closed based on the voltage difference between the two control terminals 9 and 10. If the smart relay 1 receives a command state of close 46, the smart relay 1 controls the relay circuit to be closed 50, even when the relay circuit is being requested open based on the voltage difference between the two control terminals 9 and 10. If the smart relay 1 receives a command state of pass through 47, it will determine whether the relay circuit is being requested open or closed based on the voltage difference 48 between the two control terminals 9 and 10. The smart relay 1 will then control the relay circuit to be open if it is being requested open 49 or control the relay circuit to be closed if it is being requested closed 50.

There are 5 retention states that the smart relay 1 receives from the relay controller 33: no retention 52, force open 53, force close 54, transition open 61, and transition close 62. The smart relay 1 uses the retention states to determine its behavior when there is not active communication with the relay controller 33. If the smart relay 1 receives a retention state of no retention 52, when the smart relay has determined that it is not actively communicating with the relay controller 55, the smart relay 1 behaves the same as when the command state is pass through. The smart relay 1 determines whether the relay circuit is being requested open or closed 58, and then correspondingly controls the relay circuit to be open 59 or controls the relay circuit to be closed 60. If the smart relay 1 receives a retention state of force open 53, as soon as the smart relay 1 has determined that it is not actively communicating with the relay controller 56, the smart relay 1 controls the relay circuit to be open 59, even when the relay circuit is being requested closed. If the smart relay 1 receives a retention state of force close 54, as soon as the smart relay 1 has determined that it is not actively communicating with the relay controller 57, the smart relay 1 controls the relay circuit to be closed 60, even when the relay circuit is being requested open.

If the smart relay 1 receives a retention state of transition open 61, once the smart relay 1 has determined that it is not actively communicating with the relay controller 63, the smart relay 1 allows the relay circuit to stay closed as long as it is being requested closed 65. As soon as the relay circuit is no longer being requested closed 65, the smart relay 1 controls the relay circuit to be open 59, and does not allow the relay circuit to close again, even if it is being requested closed. At this point the smart relay retention state transitions from transition open to force open. If the smart relay 1 receives a retention state of transition close 62, once the smart relay 1 has determined that it is not actively communicating with the relay controller 64, the smart relay 1 allows the relay circuit to stay open as long as it is being requested open 66. As soon as the relay circuit is no longer being requested open 66, the smart relay 1 controls the relay circuit to be closed 60, and does not allow the relay circuit to open again, even if it is being requested open. At this point the smart relay retention state transitions from transition close to force close. The smart relay 1 does not change its retention state until active communication is re-established with the relay controller 33, at which point the smart relay 1 will accept a new command state and/or retention state from the relay controller 33.

There are 2 volatile states that the smart relay 1 receives from the relay controller 33: volatile 68 or non-volatile 69. The smart relay 1 uses the volatile state to determine whether to change its retention state in the event of a power cycle. If the smart relay 1 receives a volatile state of volatile 68, when the smart relay 1 experiences a power cycle 70 the smart relay 1 does not maintain the retention state that it had prior to the power cycle, the retention state instead becomes no retention 72. If the smart relay 1 receives a volatile state of non-volatile 69, when the smart relay 1 experiences a power cycle 71 the smart relay 1 maintains the retention state that it had prior to the power cycle 73. The smart relay microcontroller 2 uses non-volatile memory in order to execute the volatile state of non-volatile 69. When the smart relay 1 receives a volatile state of non-volatile 69, the smart relay microcontroller 2 writes the retention state to non-volatile memory. When the smart relay 1 experiences a power cycle 71, as soon as the smart relay microcontroller 2 boots up it retrieves the retention state from the appropriate location in the microcontroller 2 non-volatile memory.

In an automotive anti-theft application, the smart relay 1 is installed in place of the conventional relay that controls the +12V power to the fuel injectors and spark plugs. In this case, an authorized user can arm the anti-theft system while they are driving. The authorized user requests the anti-theft system to arm through a user interface to the relay controller 33. The relay controller 33 then sends a single command to the smart relay 1 with a command state of pass through 47, a retention state of transition open 61, and a volatile state of non-volatile 69.

While the vehicle is driving, the vehicle's engine ECU requests the relay circuit closed to provide +12V power to the fuel injectors and spark plugs. Since the smart relay command state is pass through 47, the smart relay 1 controls the relay circuit closed 50, and the vehicle drives normally. After the user stops the vehicle and turns the key off, the engine ECU requests the relay circuit open to remove +12V power from the fuel injectors and spark plugs. Since the smart relay command state is pass through 47, the smart relay 1 controls the relay circuit open 49, and the vehicle shuts off normally. The smart relay retention state is transition open 61, and the smart relay 1 has determined that it is not actively communicating with the relay controller 63, since only a single command from the relay controller 33 was sent. The relay circuit has transitioned from closed to open 65, and now the smart relay 1 will not allow the relay circuit to close again 59, even if it is being requested closed.

If an unauthorized user attempts to start the vehicle with the key, but has not disarmed the anti-theft system, the engine ECU will request the relay circuit closed to provide +12V power to the fuel injectors and spark plugs. However, the unauthorized start will not be allowed since the smart relay 1 will keep the relay circuit open, +12V power will not be provided to the fuel injectors and spark plugs, which prevents the vehicle from starting. At this point the smart relay retention state has transitioned from transition open to force open. The smart relay volatile state is non-volatile 69, so even if the unauthorized user unplugs the smart relay 1 and plugs it back in, the retention state will remain force open 73. If the unauthorized user then attempts to again to start the vehicle with the key, the smart relay 1 will still keep the relay circuit open even though the engine ECU is requesting the relay circuit closed, and +12V power will not be provided to the fuel injectors and spark plugs.

When the authorized user disarms the anti-theft system through a user interface to the relay controller 33, the relay controller 33 then sends a single command to the smart relay 1 with a command state of pass through 47, a retention state of no retention 52, and a volatile state of non-volatile 69. When the authorized user then attempts to start the vehicle, the engine ECU will request the relay circuit closed and the smart relay 1 will control the relay circuit closed 50 since the command state is pass through 47. +12V power will be provided to the fuel injectors and spark plugs and the vehicle will start, drive, and shut off as normal. The smart relay 1 will determine that it is not actively communicating with the relay controller 33 after a timeout 55, since only a single command from the relay controller 33 was sent. The smart relay 1 will continue to control the relay circuit based on the relay circuit requests from the engine ECU 58, since the retention state is no retention 52. The vehicle will start, drive, and shut off as normal. The smart relay volatile state is non-volatile 69, if the authorized user unplugs the smart relay 1 and plugs it back in, the retention state will remain no retention 73.

The relay controller 33 has a microcontroller 34, external inputs 41 and 42, and a power line communication modem 35. The relay controller 33 sends commands to the smart relay 1 including the command state, retention state, and volatile state. The relay controller 33 receives status from the smart relay 1 including the request state of the relay circuit, control state of the relay circuit, and its last received commands. The relay controller microcontroller 34 monitors the relay controller external inputs 41 and 42. The relay controller microcontroller 34 can monitor any number of external inputs 41 and 42, limited only by the hardware capability of the relay controller microcontroller 34. The relay controller microcontroller 34 uses the external inputs 41 and 42 and the status received from the smart relay 1 to determine the appropriate commands to send to the smart relay 1 using the relay controller power line communication modem 35.

In an automotive application, the relay controller 33 can be a standalone ECU, can be part of an existing ECU, or a can be combination of ECU's on the vehicle. The relay controller 33 can be an OEM (original equipment manufacturer) ECU included with the vehicle at the time of manufacture, or it can be an aftermarket ECU that is installed on the vehicle after the vehicle has been manufactured. The relay controller 33 can be executed on the hardware of an existing ECU on the vehicle. The existing ECU can be reprogrammed to execute the invention. The relay controller 33 can be an aftermarket product that is connected to an appropriate, standard vehicle connection outlet such as an OBD-II port, a relay socket, or a fuse port. The relay controller 33 can be custom installed by connecting to existing wires and harnesses within the vehicle, including splicing into these components when required.

The relay controller external inputs 41 and 42 can be sensors. The sensors can be wired directly to the relay controller 33. Alternatively, smart sensors can be used to communicate with the relay controller 33 wirelessly. In an automotive application, the relay controller microcontroller 34 can monitor vehicle sensors to determine the status of different vehicle systems. Existing vehicle sensors can be connected to the relay controller 33, and new sensors can be installed in the vehicle and connected to the relay controller 33 as necessary.

In an automotive application, the relay controller external inputs 41 and 42 can be data that is received from other ECUs on the vehicle on a vehicle data bus. In this case, the relay controller 33 contains the appropriate transceivers to communicate with other ECUs on a vehicle data bus using standard automotive electronic communication protocol such as CAN (Controller Area Network), RS232 Serial, ISO 9141/14230, or J1850 PWM (Pulse Width Modulation). The relay controller 33 can passively receive messages sent by other ECUs on the vehicle data bus. The relay controller 33 can request specific data parameters from other ECUs on the vehicle data bus and receive the responses for the specific data parameters. The relay controller 33 can request the specific data parameters at predetermined periodic rates. The relay controller 33 external inputs 41 and 42 can be a combination of vehicle sensors, messages received from other ECUs on the vehicle data bus, and data parameters received after requesting them on the vehicle data bus.

The relay controller external inputs 41 and 42 can be received from a user interface that allows for input from the user. The user interface can be wired directly to the relay controller 33. Alternatively, the user interface can communicate with the relay controller 33 wirelessly. Different types of wireless communication link communication protocols can be used, including Bluetooth, Bluetooth Low Energy, Wi-Fi, NFC, ZigBee, and those used for cellular and satellite communication. A wireless communication link with encrypted data is preferred. The user interface can be a software application on an existing device, such as a software application on a smartphone. Alternatively, the user interface can have a power line communication modem, and exchange data with the relay controller 33 over a power line shared by both the relay controller 33 and the user interface with a power line communication protocol. In an automotive application, the user interface can be part of an existing vehicle system, such as a dashboard head unit.

The relay controller external inputs 41 and 42 can be received from peripheral devices that are on the same circuit board as the relay controller 33. The peripheral devices can include devices such as an accelerometer, gyroscope, temperature sensor, and a real time clock. The relay controller 33 communicates with the external devices using a standard electronic communication protocol such as UART, SPI, or I2C. Alternatively, the relay controller 33 can have a wired or wireless connection to the internet. The relay controller external inputs 41 and 42 can be data that is retrieved from the internet.

The relay controller 33 can obtain power from conventional power sources such as a battery, a supercapacitor, or the electrical power grid. In automotive applications, the relay controller 33 power source could be the vehicle +12V battery. The relay controller 33 has a voltage regulator 38 that accepts a variable input voltage, typically in the range of 5V-25V, and outputs a constant voltage of 3-3.5 volts. A positive supply voltage 36 is input into the voltage regulator 38 with reference to ground 37. The voltage regulator 38 outputs a low voltage positive supply voltage 39. The relay controller microcontroller 34 and power line communication modem 35 operate at relatively low voltage, for example 3-3.5 volts, and receive power from the low voltage positive supply voltage 39 with reference to ground 37.

In an automotive application example, the relay controller 33 can determine when a vehicle has been shifted to park while idling, and then command the smart relay 1 to shut the engine off to save fuel. In this application, the smart relay 1 is installed in place of the conventional relay that controls the +12V power to the fuel injectors and spark plugs. The relay controller microcontroller 34 monitors external inputs 41 and 42 to determine if 3 conditions are met: the engine is running, the key is turned to on, the vehicle has recently shifted to park. If the relay controller microcontroller 34 determines that all 3 of these conditions are met, the relay controller 33 sends a command to the smart relay 1 to shut the engine off.

The relay controller 33 can use sensors as external inputs 41 and 42 to determine if the 3 conditions are met. A crankshaft position sensor can be used to monitor the engine speed. If the crankshaft position sensor indicates that the engine speed is greater than 0 RPM, the relay controller microcontroller 34 determines that the engine is running. A vehicle ignition switch sensor can be used to monitor if the key position is off, accessory, on, or start. If the vehicle ignition switch sensor indicates that the key position is on, the relay controller microcontroller 34 determines that the key is turned to on. A transmission shift position sensor can be used to monitor if the transmission is in park, reverse, neutral, or drive. If the transmission shift position sensor indicates that the transmission is in park, and less than 5 seconds have passed since the transmission shift position sensor first indicated that the transmission transitioned to park, the relay controller microcontroller 34 determines that the vehicle has recently shifted to park.

Alternatively, the relay controller external inputs 41 and 42 can be data that is received from other ECUs on the vehicle on the vehicle data bus. In this case, the crankshaft position sensor, vehicle ignition switch sensor, and transmission shift position sensor are monitored by other ECUs on the vehicle, which then make this data available on the vehicle data bus. The relay controller 33 contains the appropriate transceivers to communicate with other ECUs on the vehicle data bus using the appropriate standard automotive electronic communication protocol. The relay controller microcontroller 34 monitors these 3 data parameters by passively receiving the messages sent by the other ECUs on the vehicle data bus, or by requesting these 3 data parameters from other the ECUs on the vehicle data bus and receiving the responses for these 3 data parameters. The relay controller microcontroller 34 monitors these 3 data parameters to determine if the 3 conditions have been met.

Prior to the 3 conditions being met, the relay controller 33 sends the smart relay 1 a command with a command state of pass through 47, a retention state of no retention 52, and a volatile state of volatile 68. In this case, while the user is driving or idling the vehicle, the vehicle's engine ECU requests the relay circuit closed to provide +12V power to the fuel injectors and spark plugs, and the vehicle drives normally. After the user stops the vehicle and turns the key off, the engine ECU requests the relay circuit open to remove +12V power from the fuel injectors and spark plugs. Since the smart relay command state is pass through 47, the smart relay 1 controls the relay circuit open 49, and the vehicle shuts off normally.

When the relay controller microcontroller 34 determines that these 3 conditions have been met, the relay controller 33 sends the smart relay 1 a command with a command state of open 45, a retention state of force open 53, and a volatile state of volatile 68. When the smart relay 1 receives this command, the smart relay 1 controls the relay circuit to be open 49 since the command state is open, even though the engine ECU is requesting the relay circuit closed. At this point, +12V power is no longer provided to the fuel injectors and spark plugs, and the engine shuts off. Since the retention state is force open 53, if the smart relay 1 has determined that it is not actively communicating with the relay controller 33, the smart relay 1 will continue to control the relay circuit to be open 59, even when the relay circuit is being requested closed. Since the volatile state is volatile 68, if the smart relay 1 is unplugged and plugged back in, the retention state becomes no retention 72. Although it is unlikely that the smart relay 1 will be unplugged in this condition, if it is unplugged the smart relay 1 behaves the same as when the command state is pass through, and the vehicle returns to behaving normally.

After the 3 conditions have been met, and the relay controller 33 has commanded the smart relay 1 to shut the engine off, at some point the user will turn the key to off to shut the vehicle off, or will turn the key to start the engine again. In either case, the key is no longer turned to on, so the 3 conditions are no longer met. The relay controller 33 sends the smart relay 1 a command with a command state of pass through 47, a retention state of no retention 52, and a volatile state of volatile 68. The vehicle returns to behaving normally, and the engine will shut off or the engine will start depending on whether the user turned the key to off or turned the key to start. The relay controller microcontroller 34 resumes monitoring the external inputs 41 and 42 to determine if the 3 conditions are met.

The smart relay 1 and the relay controller 33 exchange data in the form of messages. The relay controller 33 sends command messages to the smart relay 1, and the smart relay 1 sends status messages to the relay controller 33. The smart relay 1 and relay controller 33 both have a power line communication modem. The power line communication modems exchange data between the smart relay 1 and the relay controller 33 over a power line shared by both the smart relay 1 and the relay controller 33 using a power line communication protocol. Power line communication allows data to be exchanged with a power line communication protocol over shared electrical wiring that is also being used for power distribution. The shared power line can carry either AC electric power or DC electric power. A power line communication modem encodes and transmits data on the shared power line. This data can be received and decoded by another power line communication modem on the shared power line.

The data can be encoded using several different methods, but must be robust to noise, as the data signal level is not significantly above the existing noise on the shared power line. Orthogonal frequency-division multiplexing (OFDM) is the preferred encoding method, although spread frequency shift keying (S-FSK) can alternatively be used. There are several OFDM implementation standards that can be used, including ITU-T G.9903 (G3-PLC), ITU-T G.9904 (PRIME), and IEEE P1901.2. The power line communication modems can transmit data in different frequency bands, typically in a frequency band of 3-500 kHz. A G3-PLC OFDM implementation with a frequency band of 150-490 kHz is the preferred implementation. The G3-PLC OFDM implementation is the physical layer of the power line communication network, which is the lowest layer. Optionally, a Media Access Control (MAC) layer can also be used, which manages access to the nodes on the shared power line and manages the unique addresses for the nodes.

The power line communication modems can optionally encrypt the data using an encryption key prior to encoding and transmitting. When the data is encrypted prior to transmitting, when it is received and decoded by another power line communication modem on the shared power line, this receiving power line communication modem must have the appropriate decryption key in order to view the data. Data encryption is preferred, since third party devices with power line communication modems will not have the appropriate decryption key. Thus the third party devices will not be able to monitor data that is being exchanged between the smart relay 1 and the relay controller 33 on the shared power line, or to inject data on the shared power line. A 256 bit symmetric-key encryption method such as Advanced Encryption Standard (AES)-256 is preferred.

In an automotive application, the shared power line is the +12V DC power bus that is connected to the vehicle +12V battery. The power line communication modems encode the data and transmit it on the +12V DC power bus with reference to the ground DC power bus. The data signal level is not significantly above the existing noise on the +12V DC power bus, and does not interfere with the other electrical components on the vehicle.

The relay controller 33 sends a command message 43 to the smart relay 1. The command message 43 contains the command state, the retention state, and the volatile state. The command message 43 contains the sequence number, which is used to keep the messages exchanged between the relay controller 33 and the smart relay 1 in sync. The command message 43 contains the timeout, which indicates to the smart relay 1 how long the command message 43 from the relay controller 33 is valid. If a new command message 43 from the relay controller 33 is not received by the smart relay 1 before the timeout has elapsed, the smart relay 1 determines that it is not actively communicating with the relay controller 33. The command message 43 contains the relay controller transmit address, which is the unique identifier of the specific relay controller 33 that is sending the message. The command message 43 contains the smart relay receive address, which is the unique identifier of the specific smart relay 1 that is the intended receiver of the message. A mask may be used on the smart relay receive address, which allows any specific smart relays whose unique identifier matches the mask to receive the message.

The smart relay 1 sends a status message to the relay controller 33. The status message contains the request state of the relay circuit, whether the relay circuit is being requested open or closed based on the voltage difference between the two control terminals 9 and 10. The status message contains the control state of the relay circuit, whether the smart relay 1 is controlling the relay circuit to be open or closed. The status message contains the last received command state, last received retention state, and the last received volatile state. The status message contains a sequence number, which is used to keep the messages exchanged between the smart relay 1 and the relay controller 33 in sync. The status message contains the timeout remaining, which indicates how long the last received command message 43 from the relay controller 33 is valid. If a new command message 43 from the relay controller 33 is not received by the smart relay 1 before the timeout has elapsed, the smart relay 1 determines that it is not actively communicating with the relay controller 33. The status message contains the smart relay transmit address, which is the unique identifier of the specific smart relay 1 that is sending the message. The status message contains the relay controller receive address, which is the unique identifier of the specific relay controller 33 that is the intended receiver of the message.

The relay controller 33 has a microcontroller 34 and a power line communication modem 35. Whenever the relay controller 33 is ready to send a new command message 43, the relay controller microcontroller 34 determines the command state, retention state, volatile state, sequence number, timeout, relay controller transmit address, and smart relay receive address. The relay controller microcontroller 34 then assembles this data into a message. This data is packed into the message in a manner that uses the minimum number of bytes. The relay controller microcontroller 34 communicates with the relay controller power line communication modem 35 over an electrical connection using a standard electronic communication protocol such as UART (universal asynchronous receiver/transmitter), SPI (serial peripheral interface), or I2C (inter-integrated circuit). UART is the preferred standard electronic communication protocol. The relay controller microcontroller 34 sends the assembled message to the relay controller power line communication modem 35 over the electrical connection using the shared electronic communication protocol. The power line communication modem 35 encodes the data from the assembled message using the power line communication protocol and transmits the message on the shared power line. The power line communication modem 35 can optionally encrypt the assembled message prior to encoding.

Similarly, the smart relay 1 has a microcontroller 2 and a power line communication modem 3. Whenever the smart relay 1 is ready to send a new status message, the smart relay microcontroller 2 determines the request state of the relay circuit, control state of the relay circuit, last received command state, last received retention state, last received volatile state, sequence number, timeout remaining, smart relay transmit address, and relay controller receive address. The smart relay microcontroller 2 then assembles this data into a message. This data is packed into the message in a manner that uses the minimum number of bytes. The smart relay microcontroller 2 communicates with the smart relay power line communication modem 3 over an electrical connection using a standard electronic communication protocol such as UART, SPI, or I2C. UART is the preferred standard electronic communication protocol. The smart relay microcontroller 2 sends the assembled message to the smart relay power line communication modem 3 over the electrical connection using the shared electronic communication protocol. The power line communication modem 3 encodes the data from the assembled message using the power line communication protocol and transmits the message on the shared power line. The power line communication modem 3 can optionally encrypt the assembled message prior to encoding.

A single relay controller 33 can send command messages to multiple smart relays and receive status messages from multiple smart relays. Each smart relay 1 and each relay controller 33 have a unique identifier, which uniquely identifies that specific smart relay 1/relay controller 33. The unique identifier is stored in the non-volatile memory of the smart relay microcontroller 2/relay controller microcontroller 34, and is assigned at the time of manufacture. A single relay controller 33 can send different command messages to different relays on the same shared power line using the smart relay receive address in the command message, which is the unique identifier of the specific smart relay 1 that is the intended receiver of the message. A single relay controller 33 can send a single command message to be received by multiple relays on the same shared power line using a mask on the smart relay receive address, which allows any specific smart relays whose unique identifier matches the mask to receive the message.

The smart relay and relay controller are each capable of entering a low power sleep mode. The smart relay will only enter low power sleep mode when the relay circuit is not being commanded closed based on the last message received from the relay controller and the relay circuit is not being requested closed based on the voltage difference between the two control terminals. After the smart relay microcontroller enters the low power sleep mode, it uses an internal timer to periodically wake up, typically once per second. When the smart relay microcontroller wakes up, it monitors the voltage difference between the two control terminals to determine if the relay circuit is being requested closed. If the relay circuit is being requested closed, the smart relay microcontroller exits the low power sleep mode. When the smart relay microcontroller wakes up, it also monitors for any new command messages that have been received by the smart relay power line communication modem. If a new command message has been received, the smart relay exits the low power sleep mode.

When the smart relay microcontroller wakes up, if it determines that the relay circuit is not being requested closed, and a new command message has not been received, the smart relay microcontroller resumes the low power sleep mode. When the smart relay microcontroller wakes up, it takes only a short amount of time to determine if the relay circuit is being requested closed and to monitor for a new command message received, typically a few milliseconds. Thus the smart relay can remain in the low power sleep mode the majority of the time even though it is periodically waking up. When the smart relay exits the low power sleep mode, it sends a status message to the relay controller.

The smart relay sends the status message to provide feedback to the relay controller. The smart relay sends the status message whenever it receives a new command message from the relay controller. When the smart relay receives a new command message, prior to sending the status message the smart relay updates the last received command state, last received retention state, last received volatile state, and timeout remaining based on the information from the new command message. The smart relay can send the status message more frequently as needed, for example at a periodic interval. The smart relay can send the status message whenever there is a change in the request state of the relay circuit or a change in the control state of the relay circuit. In this case, prior to sending the status message, the smart relay updates the request state of the relay circuit and the control state of the relay circuit.

The command message sent by the relay controller allows the smart relay to act deterministically when the smart relay is not actively communicating with the relay controller. A single command message provides sufficient information to allow the smart relay to deterministically control the relay switched terminals open or closed based on transitions in the requests on the relay control terminals and based on power cycles. There are many applications where there is a constraint on the frequency of communication between the smart relay and the relay controller, and it is advantageous to only communicate infrequently. There may be constraints on the bandwidth of the communication channel or power constraints on the smart relay or relay controller that prevent frequent communication.

When single or infrequent command messages from the relay controller are used to deterministically control the smart relay, the relay controller sets the timeout in the command message to 0. When the smart relay receives a timeout of 0, it immediately determines that the timeout has elapsed and that it is not actively communicating with the relay controller. The smart relay uses the command state, retention state, and volatile state received in the command message to deterministically control the relay switched terminals open or closed based on transitions in the requests on the relay control terminals and based on power cycles.

When single or infrequent command messages from the relay controller are used to deterministically control the smart relay, the relay controller continues to monitor the relay controller external inputs. If the relay controller external inputs have changed sufficiently, the relay controller adjusts the command state, retention state, and volatile state appropriately and then sends a new command message to the smart relay.

When single or infrequent command messages from the relay controller are used to deterministically control the smart relay, the relay controller continues to monitor the status message received from the smart relay, including the request state of the relay circuit. If the status message from the smart relay has changed sufficiently, the relay controller adjusts the command state, retention state, and volatile state appropriately and then sends a new command message to the smart relay.

In the previously described automotive anti-theft application, there is frequently a long time between vehicle start attempts. When the vehicle is turned to off, the vehicle enters in a low power sleep mode to conserve the vehicle battery. When the vehicle is turned to off the relay controller and smart relay also need to conserve the vehicle battery, and thus there is a power constraint that prevents frequent communication between the relay controller and smart relay. The smart relay can appropriately immobilize indefinitely based on a single command message from the relay controller, as described in the application. The relay controller sends the smart relay a single command message with a command state of pass through, a retention state of transition open, a volatile state of non-volatile, and a timeout of 0. When the smart relay receives a timeout of 0, it immediately determines that the timeout has elapsed and that it is not actively communicating with the relay controller.

In this automotive anti-theft application, the smart relay and relay controller enter the low power sleep mode while the vehicle is not driving or attempted to be started to conserve the vehicle battery. After the user turns the key off, the relay circuit is not being requested closed by the engine ECU. In the last received command message from the relay controller, the last received command state is pass through and the retention state is transition open, so the relay circuit is not being commanded closed. The smart relay can then enter the low power sleep mode. When the smart relay is in the low power sleep mode, it wakes up once per second to monitor if the relay circuit is being requested closed by the engine ECU because user has turned the key to on. If the user has turned the key to on, and the relay circuit is being requested closed, the smart relay microcontroller exits the low power sleep mode. When the smart relay wakes up, it also monitors for any new command messages that have been received by the smart relay power line communication modem. If a new command message has been received, the smart relay exits the low power sleep mode.

In this automotive anti-theft application, the relay controller external inputs are received from a user interface that allows for input from the user. When the user changes the user input from armed to disarmed, the relay controller determines that the relay controller external inputs have changed sufficiently. The relay controller sends the smart relay a single command message with a command state of pass through, a retention state of no retention 52, a volatile state of non-volatile 69, and a timeout of 0. When the smart relay receives a timeout of 0, it immediately determines that the timeout has elapsed and that it is not actively communicating with the relay controller.

When the relay controller and the smart relay are communicating with active communication, the relay controller sends the command message periodically. There is frequently a constraint on the rate of communication between the smart relay and the relay controller. There may be constraints on the bandwidth of the communication channel or power constraints on the smart relay or relay controller. When a single relay controller is communicating with multiple smart relays, the rate of communication between the smart relays and the relay controller is further constrained. Typically, the relay controller sends the command message at a periodic rate that is as fast as possible but still within the constraints of the application. The periodic rate that the relay sends the command message at is typically between 100 milliseconds and 5 seconds.

The relay controller typically sets the timeout in the command message to slightly longer than the periodic rate of the command message, typically 1.5-2 times the periodic rate of the command message. If a new command message from the relay controller is not received by the smart relay before the timeout has elapsed, the smart relay determines that it is not actively communicating with the relay controller. Since the timeout is slightly longer than the periodic rate of the command message, there will be active communication between the relay controller and the smart relay under normal conditions.

When the relay controller and the smart relay are communicating with active communication, the relay controller continues to monitor the relay controller external inputs. If the relay controller external inputs have not changed sufficiently, the command state, retention state, and volatile state will typically be sent with the same states in the periodic command message. If the relay controller external inputs have changed sufficiently, the relay controller adjusts the command state, retention state, and volatile state appropriately. The updated command state, retention state, and volatile state will be send in the next periodic command message.

When the relay controller and the smart relay are communicating with active communication, the relay controller continues to monitor the status message received from the smart relay, including the request state of the relay circuit. The relay controller can use the status message received from the smart relay as feedback. If the status message from the smart relay has changed sufficiently, the relay controller adjusts the command state, retention state, and volatile state appropriately. The updated command state, retention state, and volatile state will be sent in the next periodic command message.

Figure 7:
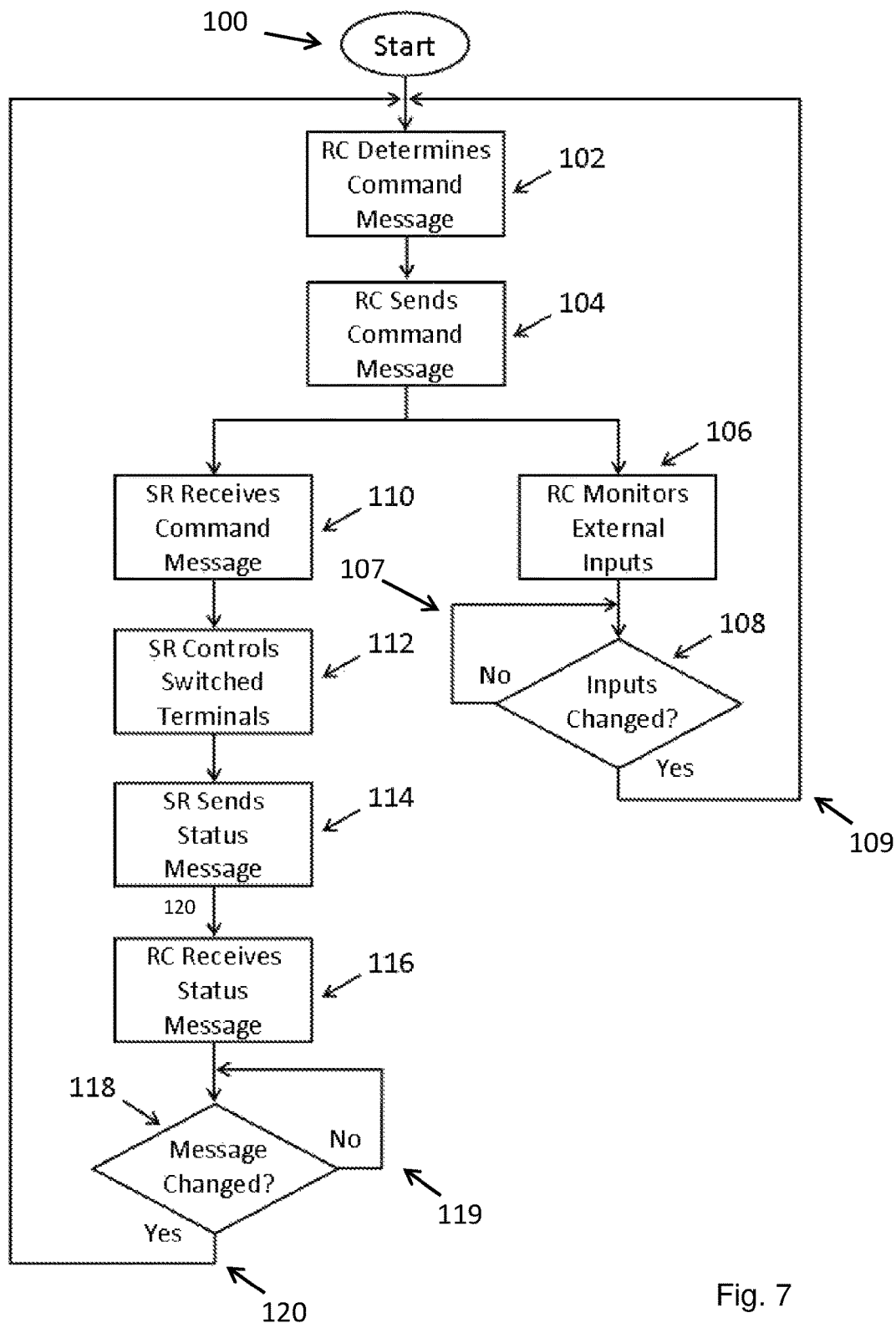
FIG. 7 illustrates a block diagram of the relay controller using the relay controller external inputs and/or the information received in the smart relay status message as feedback according to a preferred embodiment of the invention.

FIG. 7 illustrates a block diagram of the relay controller using the relay controller external inputs and/or the information received in the smart relay status message as feedback. After start 100, initially, at step 102 the relay controller determines the command message, including the command state, retention state, volatile state, and timeout of the command message. The relay controller then takes this information along with sequence number, relay controller transmit address, and smart relay receive address and assembles the information into a message. The relay controller then sends this command message to the smart relay on the shared power line using the relay controller power line communication modem at step 104. The relay controller can send single or infrequent command messages, or the relay controller can send the command message periodically. After the command message is sent, the relay controller monitors the external inputs at step 106. The relay controller then determines if the relay controller external inputs have changed sufficiently at decision step 108. If the relay controller external inputs have not changed sufficiently, the relay controller continues to monitor external inputs for a sufficient change as shown in the "NO" decision line 107. If the relay controller external inputs have changed sufficiently, the relay controller transitions back to determine the command message at YES" decision line 109. This includes adjusting the command state, retention state, volatile state, and timeout of the command message appropriately. In this case the relay controller uses the external inputs as feedback. After the command message is sent, the smart relay receives the command message on the shared power line using the smart relay power line communication modem at step 110. The smart relay uses the received command state, retention state, volatile state, and timeout from the command message along with the request on the relay control terminals to determine how to control the relay switched terminals at step 112. The smart relay then assembles the request state of the relay, control state of the relay circuit, last received command state, last received retention state, last received volatile state, timeout remaining, sequence number, smart relay transmit address, and relay controller receive address into the status message. The smart relay then sends the status message to the relay controller on the shared power line using the smart relay power line communication modem at step 114. The relay controller receives the status message on the shared power line using the relay controller power line communication modem at step 116. The relay controller monitors the information received in the status message, including the request state of the relay circuit. The relay controller then determines if the information received in the status message has changed sufficiently at step 118. If the information received in the status message has not changed sufficiently, the relay controller continues to monitor the status message for a sufficient change as shown in "NO" decision line 119. If the information received in the status message has changed sufficiently, the relay controller transitions back to determine the command message at "YES" decision line 120. This includes adjusting the command state, retention state, volatile state, and timeout of the command message appropriately. In this case the relay controller uses the status message as feedback.

In the previously described automotive fuel saving on shift to park application, the relay controller and the smart relay are communicating with active communication. The relay controller external inputs are the crankshaft position sensor, vehicle ignition switch sensor, and transmission shift position sensor. The relay controller monitors these external inputs to determine whether 3 conditions are met: the engine is running, the key is turned to on, and the vehicle has recently shifted to park. While these conditions are not met, the relay controller sends the periodic command message with the same states for the command state, retention state, and volatile state. The relay controller sends the command message at a periodic rate of 500 milliseconds with a timeout of 750 milliseconds. When the relay controller determines that the 3 conditions are met, the relay controller adjusts the command state, retention state, and volatile state appropriately. The updated command state, retention state, and volatile state are sent in the next periodic command message.

When the relay controller and the smart relay are communicating with active communication, the smart relay can use the relay controller external inputs as feedback to provide more precise control over the smart relay. The relay controller initially sets the timeout in the command message to the expected maximum amount of time that the smart relay will be controlled for. Once the smart relay receives the message, and controls the relay circuit according to the command state, retention state, and volatile state from the command message; the relay controller monitors for changes in the external inputs. As the external inputs change, the relay controller determines an updated amount of time that the smart relay will be controlled for. At the next periodic interval, the relay controller then sends the command message with the same command state, retention state, and volatile state; but with a new timeout that is the updated amount of time that the smart relay will be controlled for. During the time that the smart relay is being controlled, the relay controller will often be able to send multiple command messages, each with an updated timeout. Each command message will typically have an updated timeout that is smaller and more accurate than the previous message.

The relay controller uses the timeout in the command message to provide precise control over the smart relay. The timeout in the command message is typically provided in milliseconds, although it can have a higher resolution than this. There is a constraint on the rate of communication between the smart relay and the relay controller that typically does not allow communication on the order of milliseconds. Thus when the relay controller and the smart relay are communicating with active communication, the relay controller cannot send the periodic command messages to the smart relay every millisecond.

The relay controller can use the timeout in the command message to provide deterministic control of the smart relay at a higher resolution than the periodic control messages, on the order of milliseconds. When the relay controller needs to provide precise control over the smart relay at a higher resolution than the periodic control messages, the relay controller sets the timeout to a time that is less than the periodic rate of the command messages. As soon as the timeout is reached, the smart relay determines that there is not active communication with the relay controller. The smart relay uses the retention state and volatile state that it last received from the relay controller to deterministically control the relay switched terminals open or closed based on transitions in the requests on the relay control terminals and based on power cycles. As soon as the next periodic message is received by the relay controller, the smart determines that there is active communication with the relay controller, and communication resumes normally.

In an automotive aftermarket start/stop application, two smart relays replace the existing conventional automotive relays. This application allows the vehicle user to command the engine in a conventional internal combustion engine vehicle to turn off to save fuel, for example at a traffic light, and then to command the engine to restart. The first smart relay is installed in place of the conventional "powertrain" relay that controls the +12V power to the engine's fuel injectors and spark plugs. When the relay circuit that the conventional powertrain relay is installed in is closed, the vehicle's engine will continue to run if it was running previously and is allowed to start if the engine is not running. When the relay circuit that the conventional powertrain relay is installed in is open, the vehicle's engine will stop running if it was running previously, and the engine will not be allowed to start. The second smart relay is installed in place of the conventional "starter" relay that controls the +12V power to the engine's starter motor. When the relay circuit that the conventional powertrain relay is installed in is closed, the starter motor will run, which will cause the engine to turn at a high enough RPM to allow the engine to start. When the relay circuit that the conventional powertrain relay is installed in is open, the starter motor will not run, and the engine will not be allowed to start.

The relay controller monitors 4 external inputs: a vehicle ignition switch sensor, a vehicle speed sensor, an engine speed sensor, and a user input start/stop request. The relay controller is able to communicate with each of the 2 smart relays individually by using 2 different receive addresses in the command messages that the relay controller sends. The relay controller sends the command messages to each of the 2 smart relays at a periodic rate of 250 milliseconds. Normally the relay controller sends each of the 2 smart relays a periodic command message with a command state of pass through, a retention state of no retention, and a volatile state of volatile, and a timeout of 375 milliseconds. At this point the vehicle will operate according to the requests from the vehicle engine ECU. The vehicle's engine will start when the vehicle user turns the ignition key to start, the vehicle will drive, and then the vehicle's engine will turn off when the user turns the ignition key to off; as it does normally.

The relay controller monitors the external inputs for 4 conditions to determine if the vehicle user is commanding the engine to turn off to save fuel: the vehicle ignition key position is on, the vehicle speed is 0, the engine speed is greater than the minimum engine speed at idle, and the vehicle user has input a start/stop request. If the relay controller determines that all 4 of these conditions are met, the relay controller adjusts the command state, retention state, volatile state, and timeout appropriately. The relay controller sets the command state to open, the retention state to no retention, the volatile state to non-volatile, and the timeout of 2 seconds in the command message sent to the smart relay installed in place of the conventional powertrain relay. There is no change to the command message sent to the smart relay installed in place of the conventional starter motor. When the smart relay installed in place of the conventional powertrain relay receives the command state of open, the smart relay controls the relay circuit to be open, regardless of whether the relay circuit is being requested open or closed by the vehicle engine ECU. When the smart relay installed in place of the conventional powertrain relay controls the relay circuit to be open, the vehicle's engine transitions from running to not running.

The maximum amount of time that the vehicle's engine takes to transition from running to not running is 2 seconds. While the vehicle's engine is transitioning from running to not running, the relay controller monitors the engine speed sensor external input. As the engine speed begins to fall, the relay controller monitors this on the engine speed sensor external input and determines an updated amount of time remaining for the engine to stop running. The relay controller will then send the command message with the same command state of open, the same retention state of no retention, the same volatile state of non-volatile, but with an updated timeout that is the amount of time remaining for the engine to stop running. Since the relay controller is sending the command message at a periodic rate of 250 milliseconds, the relay controller will be able to send several command messages while the engine is transitioning from running to not running. Each command message will have an updated timeout that is smaller than the previous message.

As the engine has nearly stopped running, and the engine speed is nearly zero, the relay controller needs to provide precise control over the smart relay at a higher resolution than the periodic control messages. The relay controller sets the timeout in the command message to a time that is less than the periodic rate of the command message. As soon as the timeout is reached, the smart relay will determine that there is not active communication with the relay controller. Since the smart relay received a retention state of no retention, the smart relay will behave the same as when the command state is pass through. At this point the vehicle's engine has successfully stopped running and the vehicle will resume operating according to the request from the vehicle engine ECU. The relay controller then adjusts the command state to pass through, the retention state to no retention, the volatile state to volatile, and the timeout to 375 milliseconds. The updated command state, retention state, volatile state, and timeout are sent in the next periodic command message.

The relay controller monitors the external inputs for 4 conditions to determine if the vehicle user is commanding the engine to start after it has been turned off to save fuel: the vehicle ignition key position is on, the vehicle speed is 0, the engine speed 0, and the vehicle user has input a start/stop request. If the relay controller determines that all 4 of these conditions are met, the relay controller adjusts the command state, retention state, volatile state, and timeout appropriately. The relay controller sends a command message to each of the 2 smart relays with a command state of close, a retention state of no retention, a volatile state of non-volatile, and a timeout of 1.5 seconds. When the smart relay installed in place of the conventional powertrain relay receives the command state of close, the smart relay controls the relay circuit to be closed, regardless of whether the relay circuit is being requested open or closed by the vehicle engine ECU, and the engine is allowed to start. When the smart relay installed in place of the conventional starter relay receives the command state of close, the smart relay controls the relay circuit to be closed, regardless of whether the relay circuit is being requested open or closed by the vehicle engine ECU. This will cause the starter motor to run, which will cause the engine to turn at a high enough RPM to allow the engine to start. Since the relay circuit that the conventional powertrain relay is installed in is also closed while the starter motor is running, the vehicle's engine will start.

For the automotive aftermarket start/stop application, the amount of time that the starter motor is engaged while the vehicle's engine is starting has a large effect on the performance of the engine start. If the starter motor is not engaged for enough time, the engine will fail to start. If the starter motor is engaged for too long it will cause unnecessary wear on the starter motor. Additionally, on a vehicle with an automatic transmission with the transmission in drive, if the starter motor is engaged for too long there will be a large bump when the engine starts. When the starter motor is engaged for too long, the engine speed reaches a higher value than that needed to start and idle. At this higher RPM torque is transferred from the engine through the torque converter to the transmission, which results in large bump.

To avoid the possibility of the engine not starting, the relay controller initially sends the command messages with the maximum amount of time required to start the engine. In an example automotive aftermarket start/stop application, the maximum amount of time required to start a vehicle's engine is 1.5 seconds. While the vehicle's engine is starting, the relay controller monitors the engine speed sensor external input. As the engine begins to start, the relay controller monitors this on the engine speed sensor external input and determines an updated amount of time remaining for the engine to start. At the next periodic interval, the relay controller will then send the command messages with the same command state of close, the same retention state of no retention, the same volatile state of non-volatile, but with an updated timeout that is the amount of time remaining for the engine to start.

Since the relay controller is sending the command messages at a periodic rate of 250 milliseconds, the relay controller will be able to send several command messages while the engine is starting. Each command message will have an updated timeout that is smaller than the previous message. As the engine gets further along in the starting process, the engine speed will be getting closer and closer to the target engine speed determined by the relay controller. The relay controller will thus be able to determine a more and more accurate amount of time remaining for the engine to complete the start. In most cases this will allow for engine starts that are shorter overall than the 1.5 second maximum amount of time required to start the engine. This allows for a much more refined engine start than an open loop system, where the starter motor would always be engaged for the 1.5 second maximum amount of time required to start the engine. Additionally, this allows for less wear on the starter motor.

When the engine has nearly completed starting, the relay controller needs to provide precise control over the smart relay at a higher resolution than the periodic control messages. The relay controller sets the timeout in the command messages to a time that is less than the periodic rate of the command messages. As soon as the timeout is reached, each of the 2 smart relays will determine that there is not active communication with the relay controller. Since the smart relays received a retention state of no retention, each of the 2 smart relays will behave the same as when the command state is pass through. At this point the engine has successfully started and the vehicle will resume operating according to the requests from the vehicle engine ECU. The relay controller then adjusts the command state to pass through, the retention state to no retention, the volatile state to volatile, and the timeout to 375 milliseconds. The updated command state, retention state, volatile state, and timeout are sent in the next periodic command message.

In automotive applications, relays are frequently used to control many different high current components on the vehicle with low current signals from ECUs on the vehicle. Typical automotive applications for relays include the starter motor, fuel injectors, spark plugs, fuel pump, headlights, horn, taillights, bright lights, fog lights, door locks, window motors, sunroof motor, trunk actuator, power seats, heated seats, windshield wipers, rear defroster, HVAC blower, air conditioning compressor, accessory key position power distribution, and run key position power distribution. The smart relay 1 has the ability to control these loads off or on independently of whether a vehicle ECU is requesting the load off or on. The smart relay 1 receives commands from a relay controller 33 with external inputs 41 and 42. The relay controller external inputs 41 and 42 include a user interface, sensors, data from other vehicle ECUs, and peripheral devices. This allows for the invention to be used in many different automotive applications.

Smart relays can be used in an anti-theft application to prevent the vehicle from starting unless they receive a command from the relay controller, which can receive input from the user from the user interface. In this application the smart relays are used in place of the starter motor, fuel injector, and/or spark plug relays. Smart relays can be used in a remote start application to start the vehicle when they receive a command from the relay controller, which can receive input from the user from the user interface. In this application the smart relays are used in place of the starter motor, fuel injector, and/or spark plug relays. Smart relays can be used in an application to shut off the engine to save fuel when they receive a command from the relay controller, which can receive input from the user from the user interface. In this application the smart relays are used in place of the fuel injector and/or spark plug relays. Smart relays can be used to subsequently restart the engine to resume normal driving when they receive a command from the relay controller, which can receive input from the user from the user interface. In this application the smart relays are used in place of the starter motor, fuel injector, and/or spark plug relays.

Smart relays can be used in a remote start cabin conditioning application to pre-position the seats, turn on the heated seats, turn on the windshield wipers, turn on the rear defroster, and turn on the HVAC blower as required when they receive a command from the relay controller, which can receive input from the user from the user interface. In this application the smart relays are used in place of the power seats, heated seats, windshield wipers, rear defroster, and/or HVAC blower relays. Smart relays can be used in a keyless entry application to unlock the vehicle doors and provide a visual indication to the user by flashing the headlights when they receive a command from the relay controller, which can receive input from the user from the user interface. In this application the smart relays are used in place of the door lock and headlight relays.

Smart relays can be used in a post-accident safety application to turn off the engine and turn off the fuel pump after an accident has occurred when they receive command from the relay controller, which can determine that an accident has occurred using the accelerometer peripheral external input. In this application the smart relays are used in place of the fuel pump, fuel injector, and/or spark plug relays. Smart relays can be used to wake up the vehicle to retrieve data from the vehicle when they receive a command from the relay controller. In this application the smart relays are used in place of the accessory and/or run key position power distribution relays.

While the invention has been described in connection with a preferred embodiment, it is not intended to limit the scope of the invention to the particular form set forth, but on the contrary, it is intended to cover such alternatives, modifications, and equivalents as may be included within the spirit and scope of the invention as defined by the later issued claims. The title is intended for general description and is not to be used in construing any of the later issued claims, nor is there any intent that it be used to limit the claims in any fashion.

The invention claimed is:

1. A replacement smart relay comprising:
   a. a relay, controlled by a microcontroller operably connected through a power line communication line that receives instructions from a relay controller;
   b. the relay has a simulated resistor representative of a reference resistance;
   c. the instructions from the relay controller are capable of allowing the relay switched terminals to be controlled open or closed based on the request on the relay control terminals, to allow the smart relay to function the same as the relay it is replacing in the existing application;
   d. the instructions from the relay controller are capable of allowing the relay switched terminals to be controlled open or closed independently of the request on the relay control terminals to override a command from the existing application, based on a set of conditions determined by the relay controller; and
   e. the instructions from the relay controller allow the relay switched terminals to be controlled open or closed to a different state after loss of active communication between the smart relay and relay controller; and
   f. when the smart relay power is cycled, the instructions from the relay controller allow the relay switched terminals to be controlled open or closed in the same state as they were prior to the power cycle.

2. The replacement smart relay according to claim 1 further comprising status information received from the smart relay that the relay controller uses as feedback.

3. The replacement smart relay according to claim 1 further comprising relay controller external inputs used as feedback to provide more precise control over the smart relay.

4. The replacement smart relay according to claim 1 further comprising instructions from the relay controller that allow for deterministic control of the smart relay at a higher resolution than the normal periodic instructions.

5. The replacement smart relay according to claim 1 further comprising a power scavenging circuit.

6. The replacement smart relay according to claim 1 wherein the relay is a solid-state relay.

7. The replacement smart relay according to claim 1 further comprising relay controller external inputs from wired sensors, wireless sensors, data received from other ECUs on a data bus, user input from a user interface, or peripheral devices.

8. The replacement smart relay according to claim 1 wherein the power line communication modems can optionally encrypt the instructions using an encryption key prior to encoding and transmitting.

9. The replacement smart relay according to claim 1 wherein a single relay controller can send instructions to multiple smart relays and receive status from multiple smart relays.

10. The replacement smart relay according to claim 1 wherein the smart relay and relay controller can enter a low power sleep mode.

11. A replacement smart relay comprising:
    a. a smart relay, controlled by a microcontroller operably connected through a power line communication line that receives instructions from a relay controller;
    b. the instructions from the relay controller are capable of allowing the relay switched terminals to be controlled open or closed based on the request on the relay control terminals, to allow the smart relay to function the same as the relay it is replacing in the existing application;
    c. the instructions from the relay controller are capable of allowing the relay switched terminals to be controlled open or closed independently of the request on the relay control terminals to override a command from the existing application, based on a set of conditions determined by the relay controller; and
    d. the instructions from the relay controller allow the relay switched terminals to be controlled open or closed to a different state after loss of active communication between the smart relay and relay controller.

12. The replacement smart relay according to claim 11 further comprising a power scavenging circuit.

13. The replacement smart relay according to claim 11 wherein the smart relay power is cycled, the instructions from the relay controller allow the relay switched terminals to be controlled open or closed in the same state as they were prior to the power cycle.

14. The replacement smart relay according to claim 11 further comprising status information received from the smart relay that the relay controller uses as feedback.

15. The replacement smart relay according to claim 11 further comprising instructions from the relay controller that allow for deterministic control of the smart relay at a higher resolution than the normal periodic instructions.

16. The replacement smart relay according to claim 11 further comprising using relay controller external inputs as feedback to provide control over the smart relay.

17. A replacement smart relay comprising:
 a. a relay, controlled by a microcontroller operably connected through a power line communication line that receives instructions from a relay controller;
 b. the instructions from the relay controller are capable of allowing the relay switched terminals to be controlled open or closed independently of the request on the relay control terminals to override a command from the existing application, based on a set of conditions determined by the relay controller;
 c. the instructions from the relay controller allow the relay switched terminals to be controlled open or closed to a different state after loss of active communication between the smart relay and relay controller; and
 d. when the smart relay power is cycled, the instructions from the relay controller allow the relay switched terminals to be controlled open or closed in the same state as they were prior to the power cycle.

18. The replacement smart relay according to claim 17 further comprising a power scavenging circuit.

19. The replacement smart relay according to claim 17 further comprising status information received from the smart relay that the relay controller uses as feedback.

* * * * *